(12) United States Patent  
Basker et al.

(10) Patent No.: US 9,318,578 B2  
(45) Date of Patent: Apr. 19, 2016

(54) FINFET SPACER FORMATION BY ORIENTED IMPLANTATION

(71) Applicant: GLOBALFOUNDRIES INC., Grand Cayman (KY)

(72) Inventors: Veeraraghavan S. Basker, Schenectady, NY (US); Kangguo Cheng, Guilderland, NY (US); Bruce B. Doris, Brewster, NY (US); Johnathan E. Faltermeier, Delanson, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/628,561

(22) Filed: Sep. 27, 2012

(65) Prior Publication Data

US 2013/0020642 A1    Jan. 24, 2013

Related U.S. Application Data

(62) Division of application No. 12/611,444, filed on Nov. 3, 2009, now Pat. No. 8,716,797.

(51) Int. Cl.
| | |
|---|---|
| *H01L 21/336* | (2006.01) |
| *H01L 29/66* | (2006.01) |
| *H01L 21/8234* | (2006.01) |
| *H01L 21/265* | (2006.01) |
| *H01L 29/78* | (2006.01) |

(52) U.S. Cl.
CPC .... *H01L 29/66795* (2013.01); *H01L 21/26586* (2013.01); *H01L 21/823431* (2013.01); *H01L 29/66803* (2013.01); *H01L 29/785* (2013.01)

(58) Field of Classification Search
CPC ............................................. H01L 21/823431
USPC ................... 438/151, 696, 705; 257/347, 900
See application file for complete search history.

(56) References Cited

U.S. PATENT DOCUMENTS

| | | | |
|---|---|---|---|
| 5,546,557 A | 8/1996 | Allen et al. | |
| 6,413,802 B1 * | 7/2002 | Hu et al. | 438/151 |
| 6,838,322 B2 | 1/2005 | Pham et al. | |
| 6,885,055 B2 * | 4/2005 | Lee | 257/308 |
| 7,129,550 B2 | 10/2006 | Fujiwara et al. | |
| 7,300,837 B2 | 11/2007 | Chen et al. | |
| 7,420,230 B2 | 9/2008 | Tsuchiaki | |
| 7,476,578 B1 | 1/2009 | Cheng et al. | |
| 7,554,165 B2 * | 6/2009 | Hokazono | 257/401 |
| 2008/0217694 A1 * | 9/2008 | Anderson et al. | 257/365 |

(Continued)

FOREIGN PATENT DOCUMENTS

| | | |
|---|---|---|
| JP | 7-84839 | 7/1995 |
| JP | 2008-277416 A | 11/2008 |

(Continued)

*Primary Examiner* — Mark Prenty  
(74) *Attorney, Agent, or Firm* — Thompson Hine LLP

(57) ABSTRACT

A FinFET having spacers with a substantially uniform profile along the length of a gate stack which covers a portion of a fin of semiconductor material formed on a substrate is provided by depositing spacer material conformally on both the fins and gate stack and performing an angled ion impurity implant approximately parallel to the gate stack to selectively cause damage to only spacer material deposited on the fin. Due to the damage caused by the angled implant, the spacer material on the fins can be etched with high selectivity to the spacer material on the gate stack.

13 Claims, 8 Drawing Sheets

(56) References Cited

U.S. PATENT DOCUMENTS

2008/0265321 A1  10/2008  Yu et al.
2011/0101455 A1* 5/2011  Basker et al. ................. 257/347

FOREIGN PATENT DOCUMENTS

| JP | 2009-021456 A | 1/2009 |
| JP | 2009-503893 A | 1/2009 |

* cited by examiner

FINFET SPACER FORMATION BY ORIENTED IMPLANTATION

CROSS-REFERENCE TO RELATED APPLICATIONS

This application is a Division of U.S. patent application Ser. No 12/611,444, filed Nov. 3, 2009, which is hereby incorporated by reference in its entirety and the domestic priority of which is hereby claimed.

FIELD OF THE INVENTION

The present invention generally relates to so-called fin-type field effect transistors, also referred to as finFETs, and, more particularly, to spacer formation on the gate stack and removal of spacer material from the fin structure.

BACKGROUND OF THE INVENTION

The desire for improved performance and reduced cost of manufacture has driven integrated circuit designs to extreme integration densities and small feature sizes. High density of integration provides reduced signal propagation time and potentially higher clock speeds as well as reduced susceptibility to noise. High density of integration also provides for increased functionality to be provided on a semiconductor chip of a given size and thus supports economy of manufacture since additional functionality can often be achieved with a given sequence of material deposition and etching processes. However, higher integration density can also compromise resistance to breakdown between closely spaced structures at a given voltage and can also cause increased heating while potentially reducing the capacity of the chip to dissipate the heat generated thereon, particularly at higher clock speeds.

Accordingly, recent trends in integrated circuit designs have attempted to reduce heat generation by operation at lower voltages. However, at such lower voltages it is more difficult to control conduction in the channels of FETs of conventional designs where the conduction channel is formed in the substrate or even in a thin layer of semiconductor material such as so-called semiconductor on insulator (SOI) layers. Thus the use of low voltage compromises the on/off resistance ratio and operating margins and increases noise susceptibility of Field Effect Transistors (FETs) of conventional designs.

Accordingly, there has been much recent interest in so-called finFET designs where the conduction channel is formed as a raised fin. This type of structure can provide not only a very thin conduction channel but also allows the gate structure to be provided on two or three sides thereof so that the conduction channel can be more fully controlled at low voltage.

However, due to the small size of finFETs, it is necessary to apply sidewalls to the gate structure to facilitate location of impurity implants in the conduction channel. It is also necessary to be able to make connections to the ends of the fins which form the source and drain regions of the finFET. Therefore, the ends of the fins must be free of sidewall material. As is familiar to those skilled in the art, sidewalls are generally formed, particularly at sizes or thicknesses which are smaller than can be resolved lithographically, by applying an isotropic deposit or blanket layer of sidewall material (usually a mechanically robust and selectively etchable insulator such as a nitride) and then etching that layer with an anisotropic etch. Such a technique also deposits sidewall material on the fins and the anisotropic etch thus leaves sidewalls on at least the fin sides, as well. Since selectivity of etching is not possible in such circumstances and the sidewall thicknesses are below that which can be resolved lithographically, one known technique for removing sidewall material from the fins while leaving some sidewall material on the sides of the gate stack was to form the gate stacks of increased height (which, itself, may compromise manufacturing yield) and to perform an aggressive spacer over-etch; which operations clearly introduce severe process criticalities and may damage the gate stack spacers and/or the fins. Conversely, relatively slight changes in process parameters that reduce the over-etch may leave spacer material in place on the fins. Therefore, it can be readily appreciated that such an aggressive over-etch technique for removing spacer/sidewall material from the fins of a finFET while retaining spacer/sidewall material on the gate stack has an extremely small and critical process window and is of marginal reliability while clearly compromising manufacturing yield.

SUMMARY OF THE INVENTION

It is therefore an object of the present invention to provide a reliable process for achieving selectivity for etching the spacer/sidewall material on the fins selectively to the spacer/sidewall material on the gate stack of finFET structures in an integrated circuit.

In order to accomplish these and other objects of the invention, a method of forming a FINFET and FINFET formed by the method are provided wherein the method comprises steps of forming at least one fin of semiconductor material on a substrate, forming a gate stack across the fin, conformally depositing spacer material on the fin, gate stack and substrate, performing angled ion impurity implants into the spacer material on both sides of the fin in a direction substantially parallel to sides of the gate stack, and etching the spacer material to remove the spacer material from the fin selectively to the spacer material on the gate stack, forming a sidewall on said gate stack.

In accordance with another aspect of the invention, a FINFET is provided comprising a fin of semiconductor material located on a substrate, a gate stack located on the substrate and covering a region of the fin, and spacers on sides of the gate stack and having a substantially uniform profile both adjacent to and spaced from the fin.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
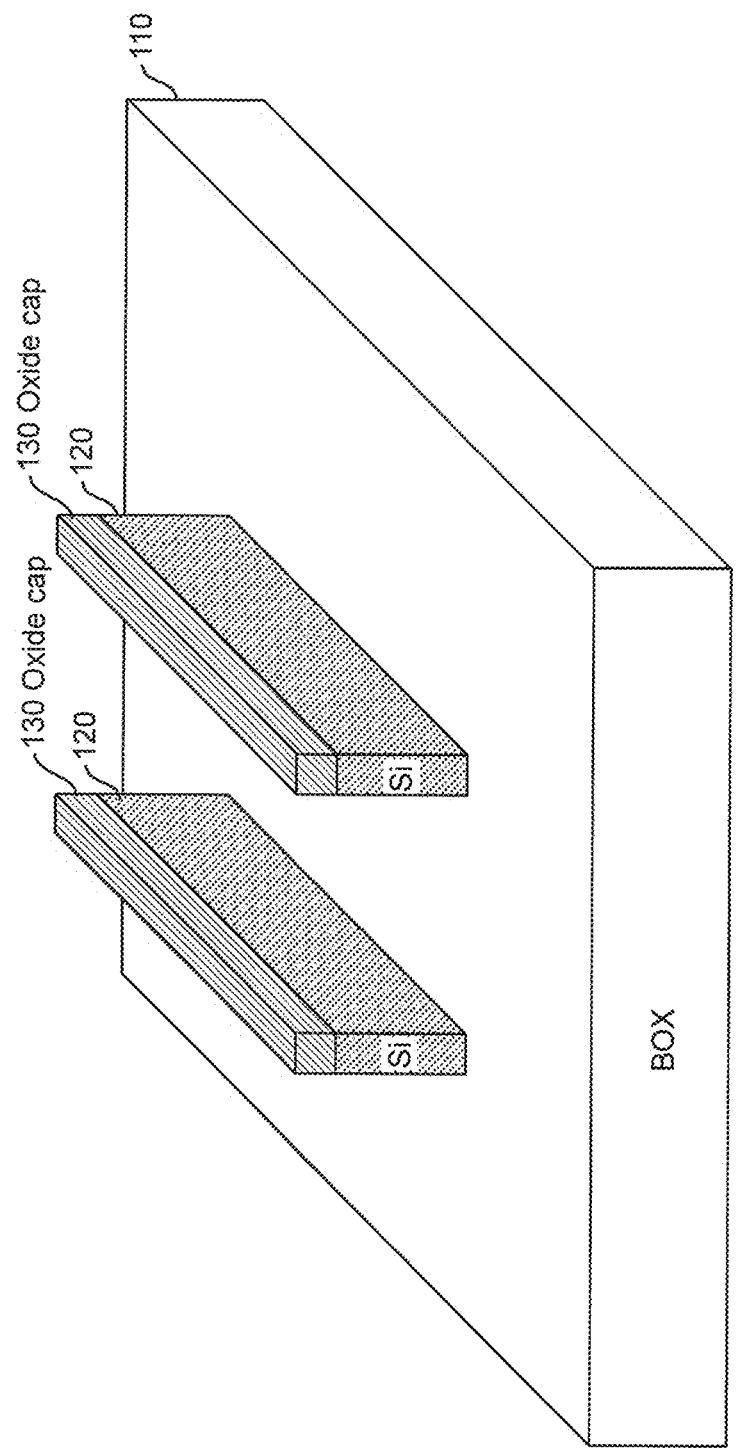
FIG. 1 is an isometric view of an initial stage in forming an integrated circuit including finFETs in accordance with the invention.

Referring now to the drawings, and more particularly to FIG. 1, there is shown an isometric view of an initial stage in the formation of finFETs in accordance with the invention. It is preferred but not necessary to form finFETs using a semiconductor on insulator (SOI) substrate. Alternatively, the FinFETs can be formed on a bulk semiconductor substrate. To obtain the structure shown in FIG. 1, an oxide (or nitride or the like) layer would be formed (e.g., by thermal growth and/or deposition) on the semiconductor surface or device layer of the wafer, a resist would be applied, exposed and developed and the oxide layer and semiconductor layer would then be etched in accordance with the resist pattern to the buried oxide (BOX) layer 110, leaving two upstanding fins with oxide caps. Alternatively, the structure in FIG. 1 can be formed by so-called spacer image transfer (SIT) process which is well-known in the art. Many variations of such a process or other processes altogether will be apparent to those skilled in the art such as selectively etching only the oxide (or nitride or the like) layer using the resist and then etching the semiconductor layer using the caps as a hard mask.

It should be noted that the width of the fins in a direction parallel to the surface of the substrate can be substantially smaller than lithographically resolvable features when fins are formed by a spacer imaging transfer technique. By the same token, the height of the fins, which corresponds to the thickness of the device layer of the original preferred SOI wafer, allows substantial surface area of the channel to be overlaid by the gate conductor which supports the principal advantages of finFETs, in general.

Figure 2:
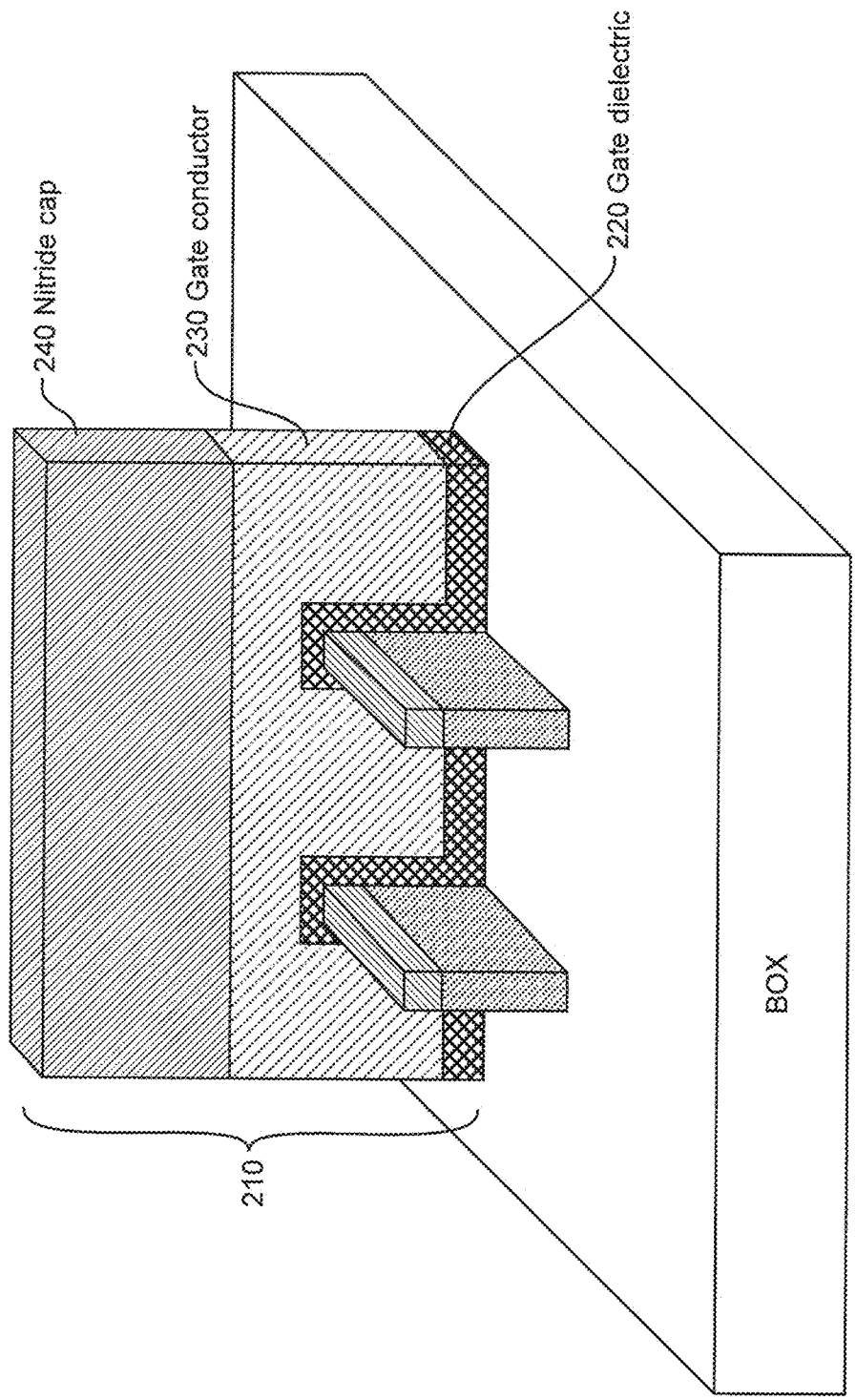
FIG. 2 is an isometric view of application of a gate stack to the structure of FIG. 1.

FIG. 2 is a similar isometric view of the structure of FIG. 1 after application of a gate stack 210. The structure of FIG. 2 would be achieved by depositing a thin conformal layer of gate dielectric and thick layers of gate conductor material and nitride or the like and again applying a resist, exposing and developing the resist and etching those layers selectively the fins 120 and fin cap 130 in accordance with the patterned resist to form a discrete gate stack comprising a gate dielectric layer 220, a gate conductor 230 and a cap 240. Again, these patterning steps are generally non-critical and numerous variations thereof or alternative processes will be evident to those skilled in the art.

Figure 3:
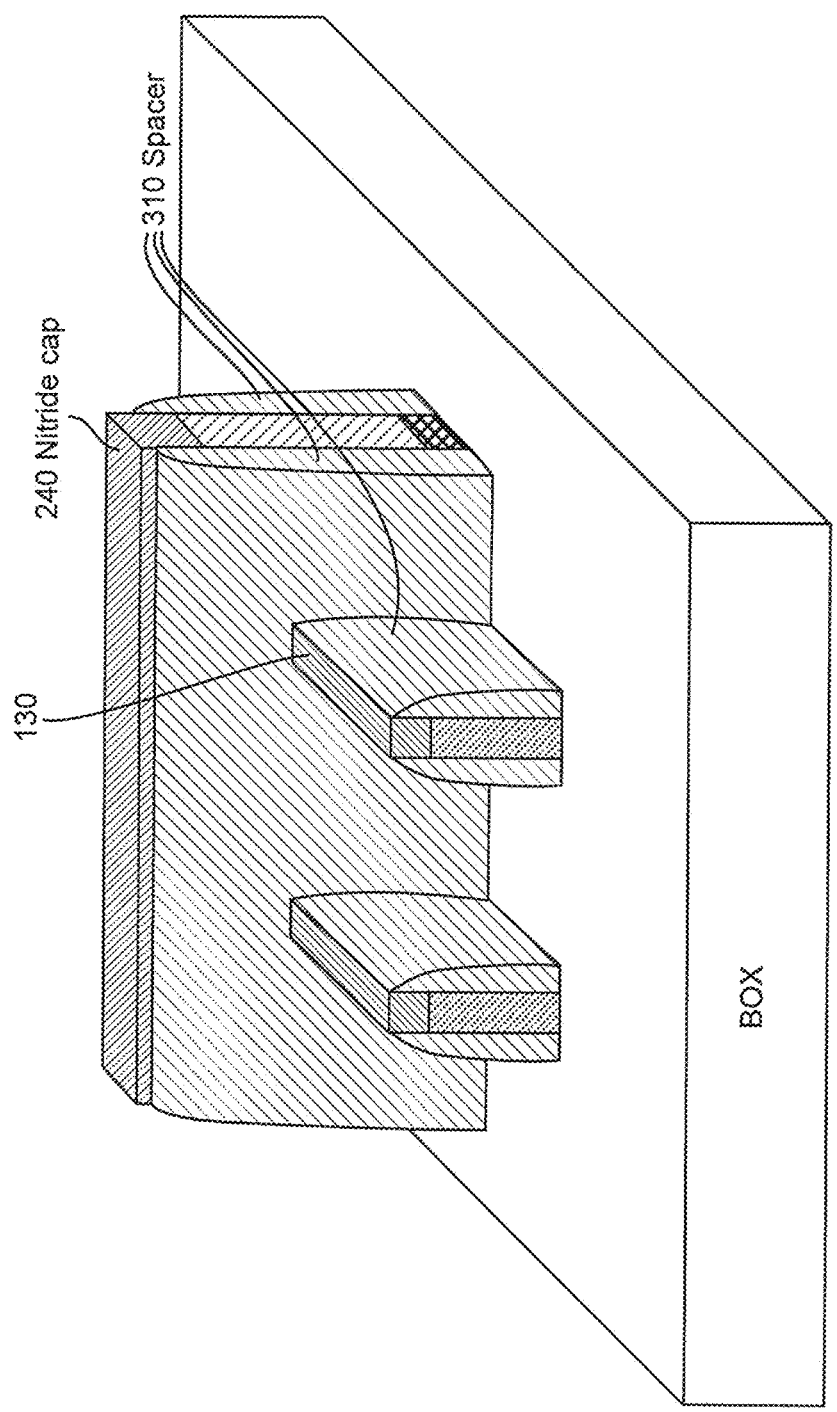
FIG. 3 is an isometric view of the addition of sidewalls to the gate stack and fins of the structure of FIG. 2.

FIG. 3 is a similar isometric view illustrating the addition of spacers to the structure of FIG. 2. As alluded to above, these spacers are necessarily formed on both the gate stack 210 and fins and cap 120, 130 by preferred spacer formation techniques of isotropically depositing a conformal layer of insulating material (e.g., silicon oxide, silicon nitride silicon oxynitride, and high-k dielectric material and the like) followed by an anisotropic etch (e.g., reactive ion etch (RIE)) of that material to form spacers 310. However, while the spacers 310 on the gate stack are generally needed for facilitating other processes such as forming extension implants and/or silicidation of the ends of the fins, the removal of the spacers from the fins is necessary for the very same reasons.

Figure 4:
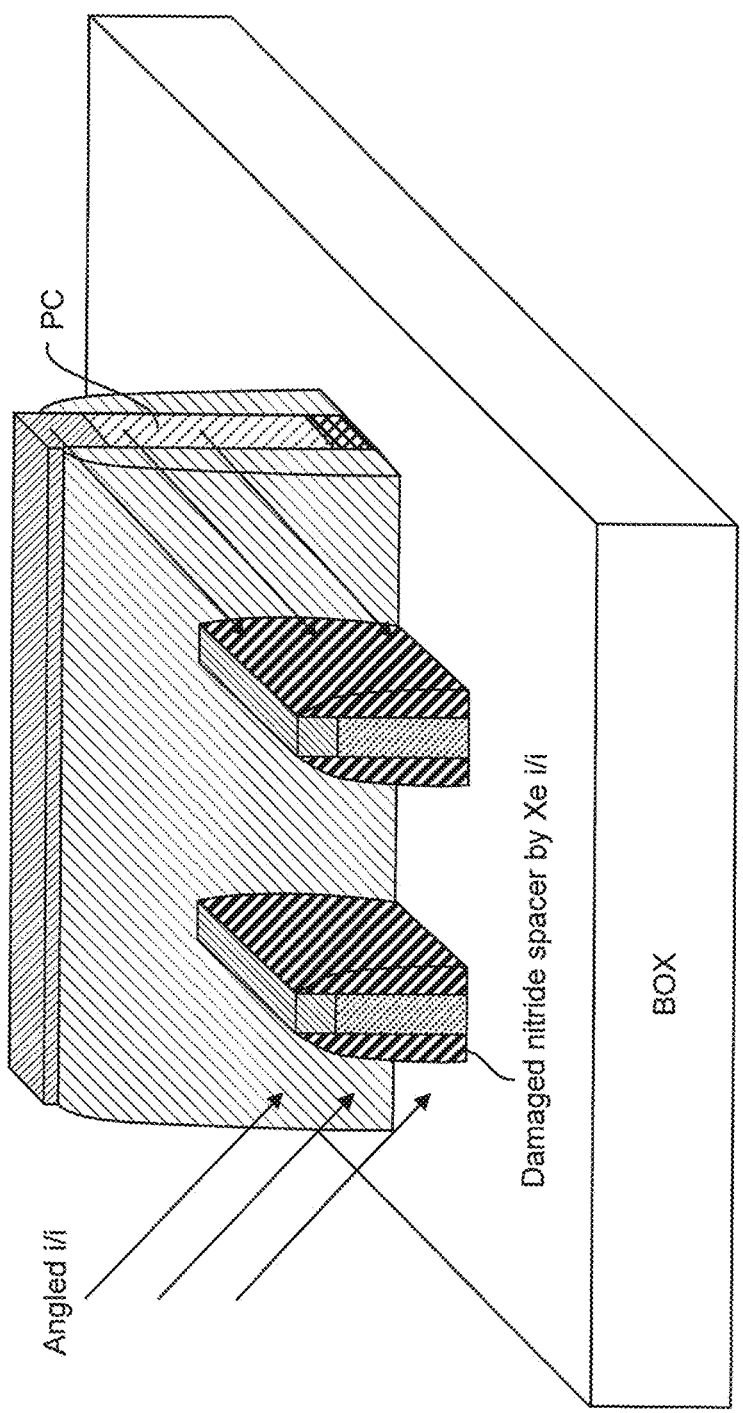
FIG. 4 is an isometric view of an angled implantation performed on the structure of FIG. 3.

Therefore, as illustrated in a similar isometric view in FIG. 4, an angled ion implantation is performed to selectively damage the sidewalls that have been formed on the fins. That is, since the gate stack is preferably (and generally) oriented substantially perpendicular to the fins, an angled implant parallel to the sides of the gate stack will also be substantially perpendicular to the fins. Thus the sidewalls on the fins can be readily damaged by a suitable ion implantation while virtually no damage is caused to the gate stack sidewalls.

A suitable ion implantation for performing selective damage to the fin sidewalls is Xenon ions at 5 keV to a concentration of $3 \times 10^{14}/cm^2$ at an angle of 30°. More generally, it is preferred to use relatively massive ions both as a matter of delivering a suitable level of kinetic energy to the sidewall material and damaging the sidewall material to cause the material to etch more rapidly. The energy and implantation concentration should provide comparable kinetic energy and crystal lattice deformation as the above preferred implantation process parameters. The angle of implantation is not critical but an angle of about 30° is believed to hold possible damage to the fins to a suitably low level while providing a distinct difference of angle of incidence of ions on the spacers on the fins from the angle of incidence of ions on the spacers on the gate stack. The ion implantation angle chosen should also assure the implantation into the entire height of the sidewall on the fin and may need to be adjusted if the fins are formed in particularly close proximity to each other (as may be of importance in design of finFETs employing a perfecting feature of the invention discussed below in connection with FIG. 6). Of course, the angled ion implantation (i/i) should be performed from or on both sides of the spacers on the fins, but can be performed in the same or separate ion implantation operations. Besides xenon, other species that can be used for damaging the spacer materials on fin sidewalls include but are not limited to argon, helium, germanium, silicon, nitrogen and the like. Depending on spacer thickness and implant species, the implant dose can range from $2 \times 10^{13}/cm^2$ to $2 \times 10^{15}/cm^2$, the implant energy can range from 0.5 KeV to 100 KeV and the implant angle can range from 15° to 75°.

Figure 5:
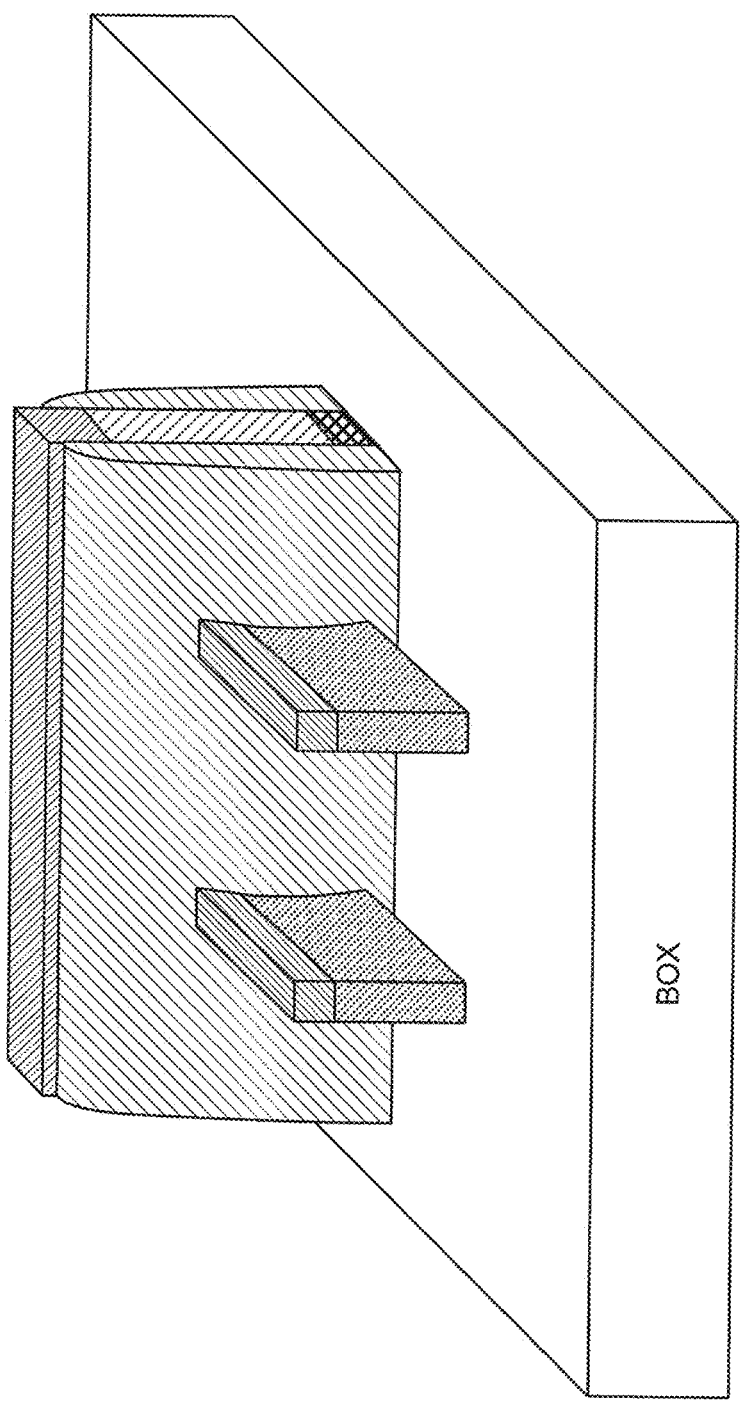
FIG. 5 is an isometric view of the structure of FIG. 4 with the sidewalls selectively removed from the fins.
Figure 6:
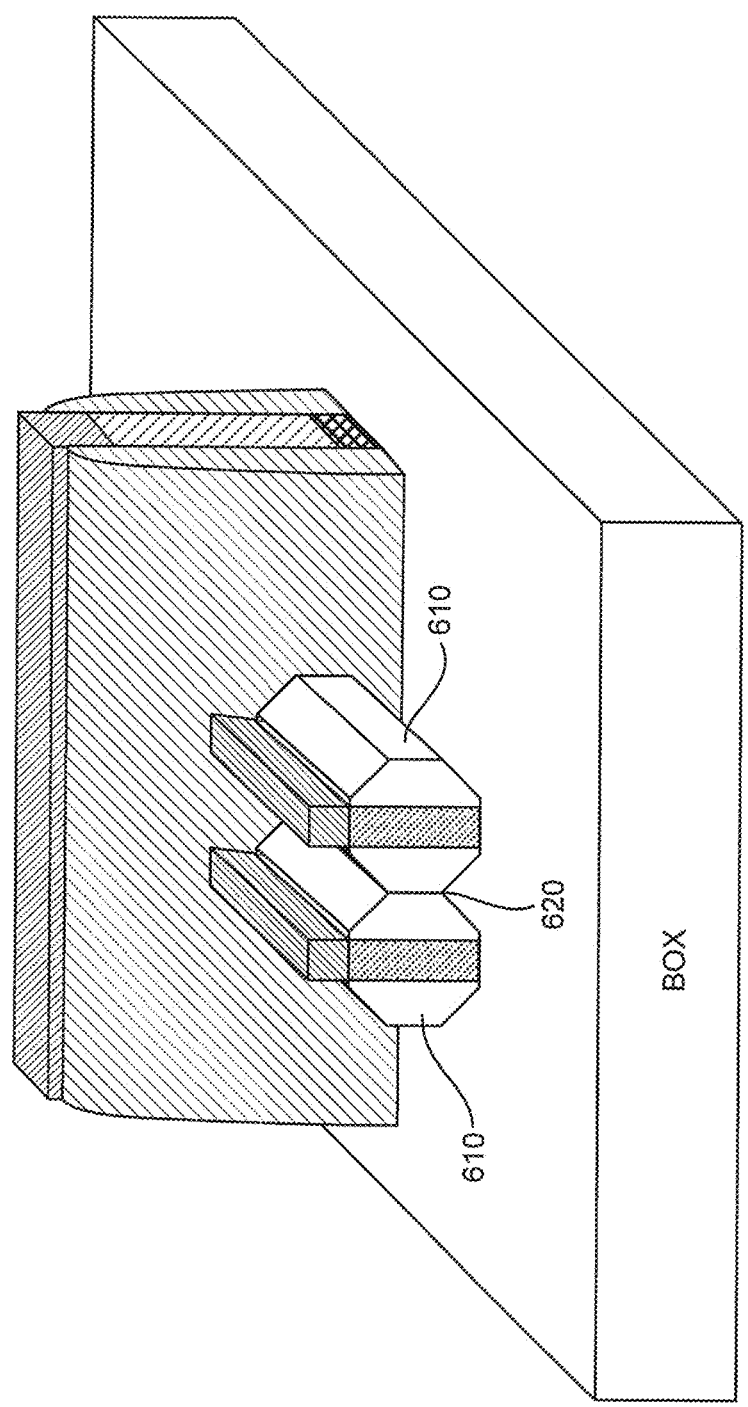
FIG. 6 is an isometric view of a preferred perfecting feature of the invention, FIG. 7 are transmission electron microscope images of cross-sections of fins and gate stack of a device manufactured in accordance with the invention demonstrating proof-of-concept of the invention.

Then, as illustrated in FIG. 5, an etch is performed preferably using a wet etch solution containing hydrofluoric acid as an etchant. Other suitable etchants will be apparent to those skilled in the art. However, if other etchants are used, the process should preferably provide somewhat anisotropic etch rates and/or be selective to the materials of the caps 130, 240. However, these attributes of the etch process are not particularly critical to the successful practice of the invention since a very substantial degree of etch selectivity is engendered by the angled ion/impurity implant and selective damage to the sidewall material incident thereto. Thus the spacers on the fins will be removed substantially to the surfaces of the sidewalls on the gate stack due to the selectivity of the etch provided by the damage due to the ion impurity implant. This provides a substantially uniform profile or shape for the sidewalls on the gate stack both adjacent to and spaced from the fin; resulting in a more sharply defined and uniformly positioned geometrical junction of the gate stack spacer with the fin and allowing a more precise and uniform result from other processes that may be desirable such as forming extension implants. The structure of FIG. 5 is thus prepared for completion of the finFETs by, for example, performing extension implants, performing an epitaxy process to thicken the exposed ends of the fins to lower source/drain resistance, and/or depositing metal and annealing to silicide the ends of the fins to form source and drain contacts or other processes deemed desirable that can be performed with greater reliability and manufacturing yield due to the more reliably complete removal of spacer material from the fins In this regard, FIG. 6 illustrates a perfecting feature of the invention which is not required for the successful practice thereof but which can be employed to advantage in finFETs made in accordance with the invention as described above but which has not been possible (at least with acceptable reliability) in finFETs made by known processes described above. Specifically, the invention provides sufficiently complete removal of spacer material from the fins 120 that epitaxial semiconductor growth may be achieved thereon. One structure that is particularly advantageous that can be achieved due to the invention is to epitaxially grow semiconductor material on the fins to increase the volume and decrease the resistance thereof as illustrated at 610. The epitaxial growth can be continued until the fins of adjacent finFETs merge as illustrated at 620 of FIG. 6. This structure is essentially a composite of two parallel connected transistors which will maintain high off resistance due to the gate being formed on multiple sides of the channel of each transistor but will have an on resistance of less than one-half of either transistor alone. Thus the composite transistor illustrated in FIG. 6 can achieve a doubled current capacity (e.g., for accommodating large fan-out connections) with little penalty in chip area required since the fins can be located as close as the minimum feature size. It should be appreciated that three or even more transistors can be merged in this way to further increase the off/on resistance ratio, increase current carrying capacity and/or reduce heat generation.

Figure 7:
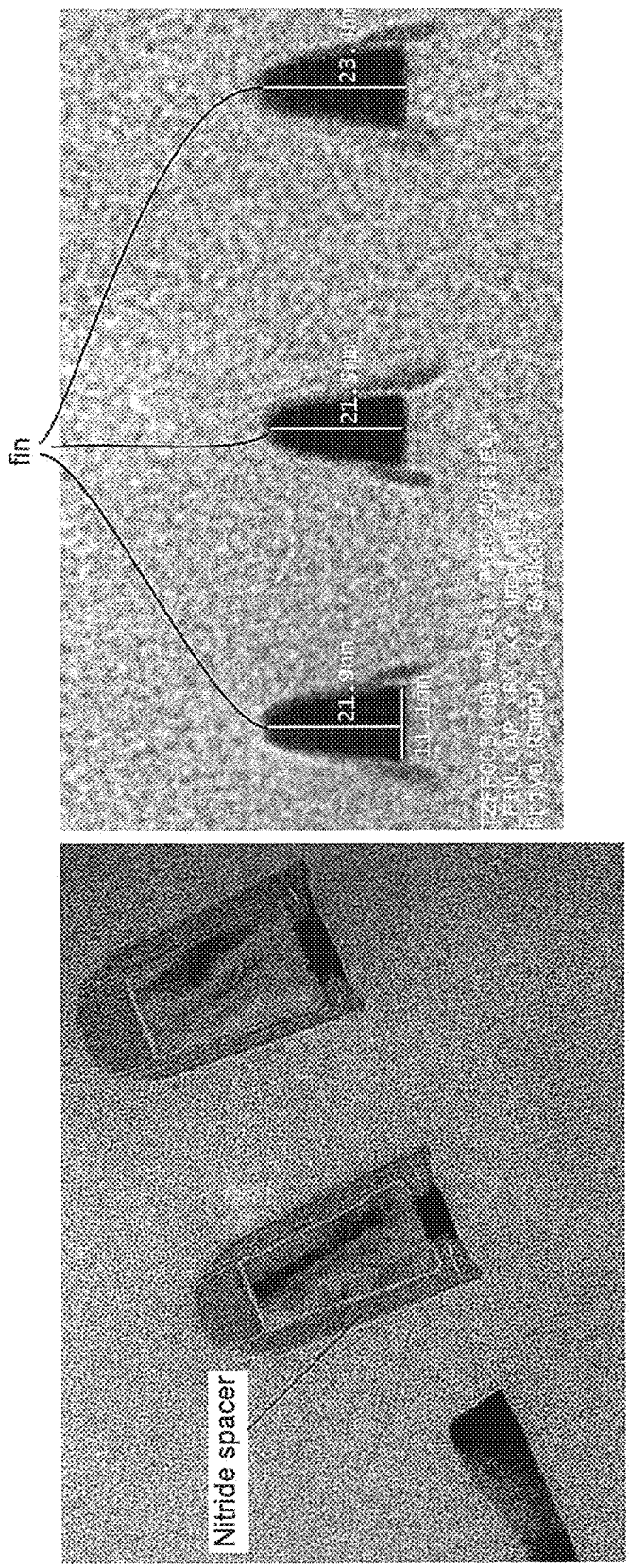

That the invention is capable of producing improved sidewall removal from the fins without damage to the necessary spacers on the gate stack is particularly evident from the scanning electron microscope images of FIG. 7. FIG. 7 includes two images of cross-section across the gate stacks and the fins, respectively. By comparing these images, it is clearly seen that the spacer material is almost completely removed from the fins except for a small amount thereof at the base of the fins while the spacer remains intact on the gate stacks.

Figure 8C:
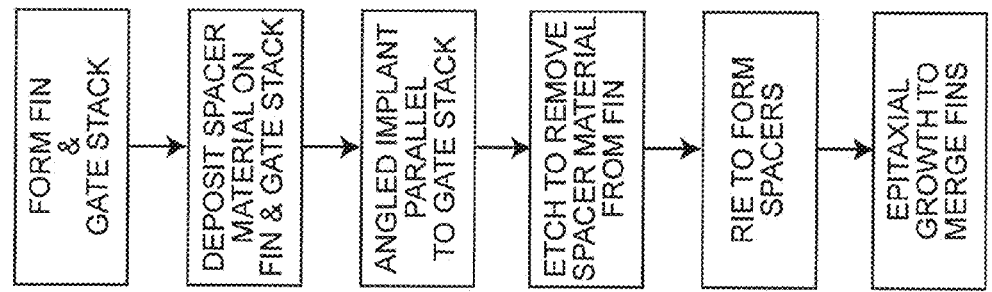
FIGS. 8A, 8B and 8C are flow charts illustrating three variant embodiments of the invention.
Figure 8B:
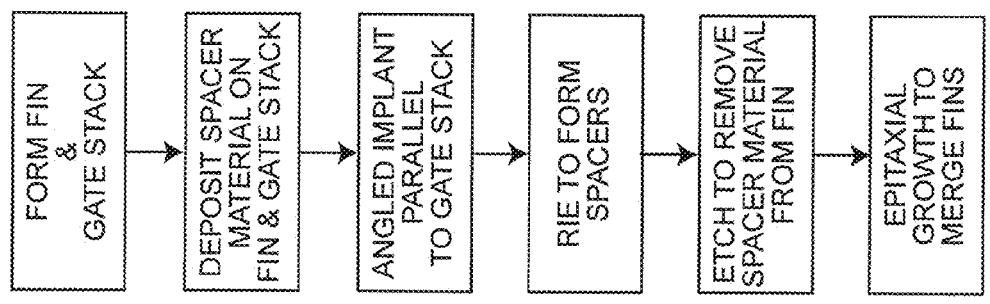
Figure 8A:
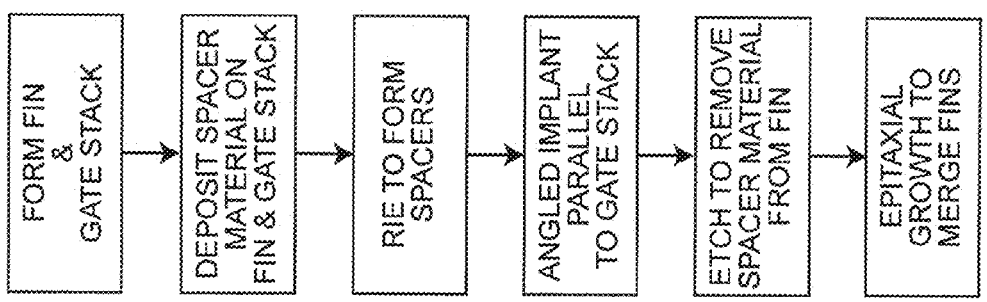

The process in accordance with the invention as described above can be performed with some variations as illustrated in the respective flow charts of FIGS. 8A, 8B and 8C, respectively. FIG. 8A corresponds to the method as described above. FIG. 8B reverses the above described steps of performing the angled ion implantation and performing the RIE to complete the spacer formation. In other words, the angled ion implantation is performed to a desired depth close to the fin within the conformal layer of sidewall material prior to the sidewall material being anisotropically etched to form the sidewalls; of which only the sidewalls on the fins will contain implanted impurities and damage. This embodiment provides the advantage of even more completely protecting the sidewalls on the gate stack from damage than is achieved by the angled implant alone. The embodiment of FIG. 8C further reverses, relative to the embodiment of FIG. 8B, the steps of removal of damaged spacer material and the formation of sidewalls from spacer material remaining on the gate stack. This embodiment has the advantage of reliably forming the structure as illustrated in FIG. 5 when the sidewalls or the conformal deposition of material is particularly thin or when, for other reasons, it may be desirable to perform the angled implantation with an energy distribution that distributes the damage throughout the thickness of the conformal deposit on the fins. Further, the embodiment of FIG. 8C can allow the two etch steps to be combined or for the RIE etch to form sidewalls to be omitted altogether.

In view of the foregoing, it is seen that the invention provides a much improved technique for reliably and substantially completely removing sidewall material from the fins of finFET structures without discernible damage to the necessary sidewalls on the gate stack of the finFET with a relatively wide process window and without requiring excessive gate stack height and/or aggressive over-etch processes. The invention thus enables additional advantageous structures to be developed as perfecting features of the invention such as well-controlled location of extension implants and the above-described epitaxial growth of semiconductor to reduce source and drain resistance and/or increase the off/on resistance ratio of a composite transistor by merging the source/drain regions of adjacent transistors.

While the invention has been described in terms of a single preferred embodiment, those skilled in the art will recognize that the invention can be practiced with modification within the spirit and scope of the appended claims.

The invention claimed is:

1. A method of forming at least one finFET, said method comprising:
    forming at least two fins of semiconductor material on a substrate by a spacer image transfer process;
    forming a gate stack across one fin of said at least two fins;
    conformally depositing a blanket layer of spacer material on said fins, gate stack and substrate;
    performing an anisotropic etch process to etch spacer material deposited in said step of conformally depositing said spacer material to form sidewall spacers;
    performing angled ion impurity implants into said spacer material on both sides of said fins in a direction substantially parallel to sides of said gate stack to engender etch selectivity in said spacer material on sides of said fins relative to spacer material on sides of said gate stack, wherein said angled ion impurity implants are performed before said anisotropic etch;
    etching said spacer material to remove said spacer material damaged by said angled impurity implants from said semiconductor material on major portions of sides of said at least two fins selectively to said spacer material on said gate stack, leaving spacer material on said gate stack; and
    performing epitaxial growth of semiconductor material on both sides of said at least two fins proximate to ends of said fins where said fins are exposed by said etching of said spacer material.

2. The method of claim 1, wherein said anisotropic etch is a reactive ion etch process.

3. The method of claim 1, wherein said gate stack extends across said at least two fins, including a further step of merging ends of said at least two fins.

4. The method of claim 1, including a further step of merging ends of said at least two fins.

5. The method of claim 1, wherein said step of performing an angled implantation is performed prior to said step of performing an anisotropic etch and said step of performing an anisotropic etch is performed after said step of etching said spacer material to remove said spacer material from said fins selectively to said spacer material on said gate stack.

6. The method of claim 1, wherein said step of forming at least two fins includes formation of a cap on at least one said fin.

7. A method of forming a finFET, said method comprising:
    forming at least one fin of semiconductor material on a substrate;
    forming a gate stack across said fin;
    conformally depositing spacer material on said fin, said gate stack, and said substrate;
    performing angled ion impurity implants into said spacer material on both sides of said fin in a direction substantially parallel to sides of said gate stack to cause damage to said spacer material on said fin and engender etch selectivity in said spacer material on sides of said fins relative to spacer material on sides of said gate stack;

performing an anisotropic etch process to etch said spacer material deposited in said step of conformally depositing said spacer material to form spacers on said sides of at least said gate stack;

etching said spacer material to remove said spacer material damaged by said angled impurity implants from sides of said fin selectively to said spacer material on said sides of said gate stack; and performing epitaxial growth of semiconductor material on both sides of said fin exposed by said etching to effectively thicken source and drain regions of said fin, wherein said step of performing angled ion impurity implants is performed prior to said step of performing an anisotropic etch.

8. The method of claim 7, wherein said anisotropic etch is a reactive ion etch process.

9. The method of claim 7, wherein said step of performing an angled implantation is performed prior to said step of performing an anisotropic etch and said step of performing an anisotropic etch is performed after said step of etching said spacer material to remove said spacer material from said fins selectively to said spacer material on said gate stack.

10. The method of claim 9, continuing said step of performing epitaxial growth to merge fins of at least two FinFETs.

11. The method of claim 7, continuing said step of performing epitaxial growth to merge fins of at least two FinFETs.

12. The method of claim 7, wherein said step of forming at least one fin includes formation of a cap on said at least one fin.

13. The method of claim 7, including a further step of merging fins of at least two FinFETs.

* * * * *